United States Patent [19]

Kanazawa

[11] Patent Number: 5,426,768
[45] Date of Patent: Jun. 20, 1995

[54] LOGIC SIMULATION WITH EFFICIENT DEADLOCK AVOIDANCE BY SELECTIVELY SUSPENDING EVENT DATA FETCH BASED ON ELEMENT INFORMATION

[75] Inventor: Kiyoshi Kanazawa, Katano, Japan

[73] Assignee: Matsushita Electric Industrial Co., Ltd., Osaka, Japan

[21] Appl. No.: 975,841

[22] Filed: Nov. 13, 1992

[30] Foreign Application Priority Data

Nov. 14, 1991 [JP] Japan .................................. 3-298665

[51] Int. Cl.$^6$ .............................................. G06F 15/20
[52] U.S. Cl. ................... 395/500; 364/578; 364/259.2; 364/264.3; 364/DIG. 1
[58] Field of Search .......................... 364/578; 395/500

[56] References Cited

U.S. PATENT DOCUMENTS

| 4,985,860 | 1/1991 | Vlach .................................. 364/578 |
| 5,018,089 | 5/1991 | Kanazawa .......................... 364/578 |
| 5,053,980 | 10/1991 | Kanazawa .......................... 364/578 |
| 5,081,601 | 1/1992 | Eirikasson ......................... 364/578 |

FOREIGN PATENT DOCUMENTS 61-110071  5/1986  Japan .
63-278150  11/1988  Japan .
275073  3/1990  Japan .

OTHER PUBLICATIONS

Iwanami Kouza Microelectronics (A Lecture of Iwanami Microelectronics), pp. 205–209, VISL No Sekkei II (A Design of VISL II), May 10, 1985.

*Primary Examiner*—Ken S. Kim
*Attorney, Agent, or Firm*—Price, Gess & Ubell

[57] ABSTRACT

Disclosed is a method for simulating an operation of an event driven logic circuit in response to changes of the signal status of each terminal of all the elements in the logical circuit, based on event data each containing event time indicating when the signal status has changed, status change indicating how the status has changed, an element identifier identifying the element, and a terminal identifier identifying the terminal, the method comprising a simulation time output step for outputting data indicating simulation time which is continuously counted up; a first selection step for selecting the event data whose event time is equal to the simulation time; a second selection step for selecting the event data whose event time is earliest among event data present for all the input terminals of the element corresponding to the event data; a simulation step for generating new event data depending on a change of the signal status of the output terminal of the element corresponding to the event data, based on the event data selected by each selection step; and a control step for suspending the operation in the second selection step based on the event data selected by the second selection step, the suspension being exercised separately for each element.

16 Claims, 6 Drawing Sheets

| addresses | values |
|---|---|
| ⋮ | ⋮ |
| 99 | false value |
| 100 | true value |
| 101 | true value |
| 102 | true value |
| ⋮ | ⋮ |

LOGIC SIMULATION WITH EFFICIENT DEADLOCK AVOIDANCE BY SELECTIVELY SUSPENDING EVENT DATA FETCH BASED ON ELEMENT INFORMATION

BACKGROUND OF THE INVENTION (1) Field of the Invention

This invention relates to a method and apparatus for logic simulation used to verify an operation of a logic circuit, and more particularly to a method and apparatus for event driven logic simulation.

(2) Description of the Related Art

Generally, in event driven logic simulation apparatuses, a status change of a signal inputted/outputted to/from the I/O terminals of each element in the logic circuit to be simulated is defined as an event generation and is referred to as event data.

Each event data includes the following information:
1. event time data indicating when a signal status has changed,
2. status change data indicating how a signal status has changed,
3. element identification data identifying the element whose signal status has changed, and
4. terminal identification data identifying the I/O terminals of the element whose signal status has changed.

The following three main procedures are repeated to simulate an operation of the logic circuit.
1. a fetch procedure: event data to evaluate is determined and then fetched from the storage unit. The event data fetched is struck off the storage unit.
2. an evaluation procedure: a new signal status of the output terminal of an element indicated by the fetched event data is calculated.
3. a transmission procedure: in response to the status change of the output terminal, new event data is generated which indicates a status change of the input terminal of an element connected with the above output terminal and then is stored in the storage unit.

The following three different methods have been proposed as the above-mentioned fetch procedure to determine event data to be evaluated.

(First Fetch Procedure)

A simulation apparatus employing a first fetch procedure is disclosed in Iwanami Koza Microelectronics, VLSI no SEKKEI II (pp. 205–209). The apparatus comprises a simulation time output unit as a synchronization mechanism which outputs data indicating simulation time to be continuously counted up, and a first fetch unit which fetches from the storage unit event data whose event time is identical with the simulation time. However, to which input terminal each event data corresponds is not taken into account in selecting event data to be fetched. Event data whose event time is earlier going through the evaluation procedure earlier. Therefore, at any point of the simulation time, all the events before the point of time have been through with the evaluation procedure. Thus, the signal status of all the terminals is determined at every point of the simulation time.

(Second Fetch Procedure)

A simulation apparatus employing a second fetch procedure is disclosed in Japanese Patent Application No. 61-110071. This apparatus has a second fetch unit, which fetches from the storage unit event data meeting the requirements required to calculate new signal status of an output terminal. The apparatus does not need a simulation time output unit.

Such event data must meet the following two requirements:
1. data for at least one event must be present for each input terminal of an element corresponding to the event data.
2. the event time of the event data must be earlier than that of any other input terminals of the element.

Here, it should be noticed that the signal status of each input terminal is verified up to its event time only if event data for them is present. This is because it is verified that no other events occur until the event time. On the other hand, when no event data is present for them, it is unknown how long a signal status of the input terminal lasts.

Accordingly, as long as event data meeting the above-mentioned requirements is present, the evaluation procedure can be carried out for the signal status up to the event time of an element indicated by the event data independently of the event time for the other elements.

However, simulation apparatuses employing either the first fetch procedure or the second fetch procedure have serious drawbacks as follows.

The simulation apparatuses only with the first fetch procedure have a difficulty in adopting a parallel procedure and/or a pipeline procedure to improve simulating speed because they are both across different points of event time. In contrast, evaluation procedures at every point of simulation time should be carried out on the premise that the evaluation procedures for all the events before a point of the simulation time have been completed.

The simulation apparatuses only with the second fetch procedure can not simulate an operation of a logic circuit having a feedback loop. Two typical such logic circuits shown in FIGS. 1 and 2 can not exercise simulation because of the following two different problems respectively.

Figure 1:
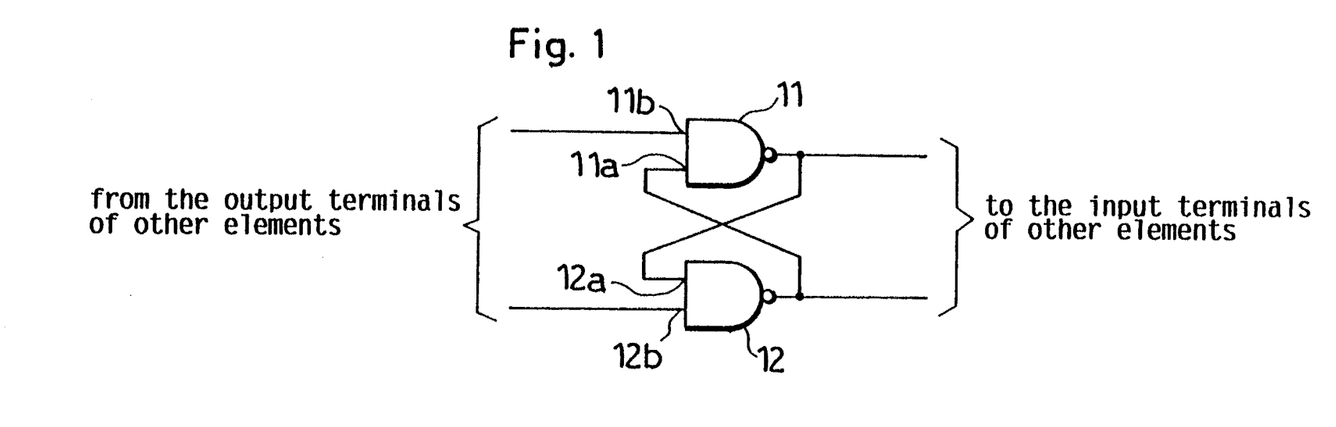
FIG. 1 shows a logic circuit diagram having a feedback loop.

The first problem is that an evaluation procedure can not be carried out unless event data for all the input terminals of an element is present. In FIG. 1 the simulation of an operation of a NAND gate 11 requires an event for an input terminal 11a, which requires the simulation of an operation of another NAND gate 12, which requires an event for another input terminal 12a, which requires the simulation of an operation of the NAND gate 11. Thus, any simulation never begins. Such a condition called deadlock is caused regardless of the presence or absence of event data for the input terminal 11b of the NAND gate 11 and/or the input terminal 12b of the NAND gate 12.

The second problem is that a simulation proceeds too far ahead because evaluation procedures can be carried out as long as event data for all the input terminals of an element is present.

Figure 2:
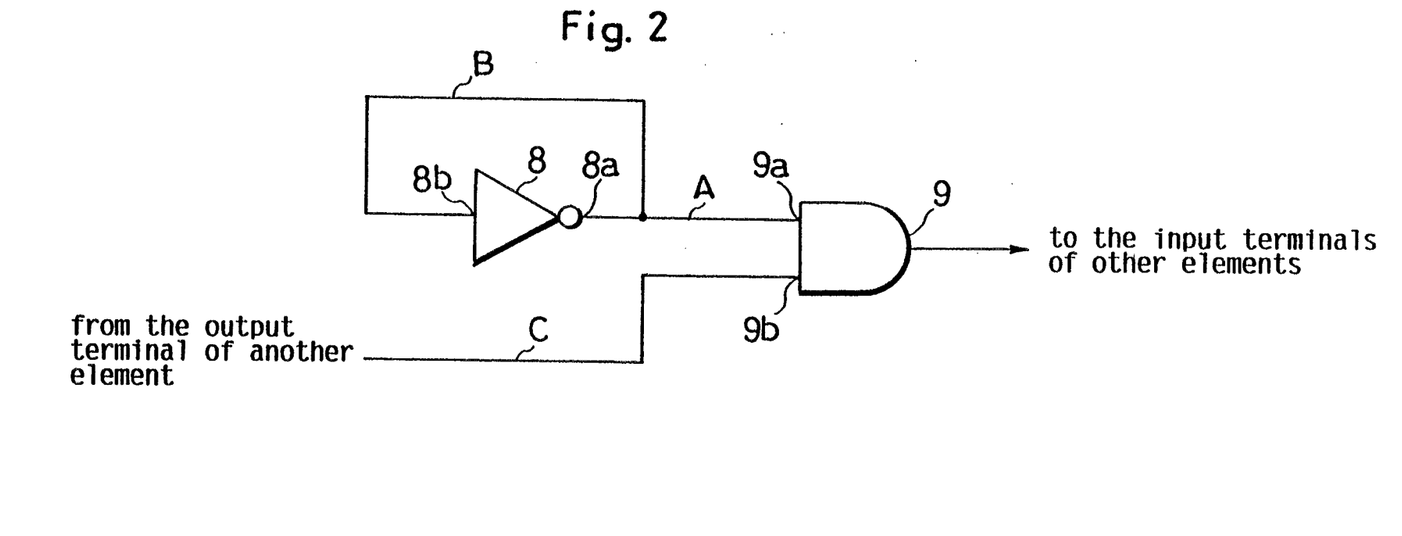
FIG. 2 shows another logic circuit diagram having a feedback loop.

An oscillating circuit shown in FIG. 2 comprises an inverter 8 and a 2-input AND gate 9. The output terminal 8a of the inverter 8 is connected with a first input terminal 9a of the AND gate 9 via a signal line A. The signal line A is further connected with the input terminal 8b of the inverter 8 through a signal line B. A second input terminal 9b of the AND gate 9 is connected with an output terminal of another element via a signal line C, the output terminal of the AND gate 9 being connected with an input terminal of another element. If a delay for an operation of the inverter 8 is made to be 10 nanoseconds, a signal status of the output terminal 8a is alternated between low level and high level every 10 nanoseconds.

In a simulation of an operation of such type of circuit as shown in FIG. 2, if data for one event indicating a change of the signal status of the only input terminal 8b of the inverter 8 is stored in the storage unit, the data always meets the above-mentioned requirements; it is fetched and applied an evaluation procedure. As a result, the signal status of the output terminal 8a is changed, so that event data for both the input terminal 8b and the first input terminal 9a is generated through a transmission procedure and then stored in the storage unit.

The event data for the input terminal 8b thus stored is serially fetched and applied an evaluation procedure in the same manner as any previous event data, and then next event data for both the input terminal 8b and the first input terminal 9a is generated. The event data for the first input terminal 9a, however, is retained in the storage unit unless an event for the second input terminal 9b occurs.

As a result, more and more event data indicating changes of the signal status of the first terminal 9a are accumulated until the storage unit overflows. A transmission procedure is not completed because newly generated event data can not be stored in the storage unit, from which the next event data is not fetched because the transmission procedure has not been completed. Thus, the overflow is never resolved falling into a deadlock. Such a situation may be caused when a pipeline procedure is executed by an apparatus for logic simulation comprising a second fetch unit, an evaluation procedure unit, and a transmission procedure unit each of which operates independently. According to this apparatus, if the storage unit cannot receive new event data from the transmission procedure unit, the transmission procedure unit cannot output it, and as a consequence, cannot receive data to produce the next event data from the evaluation procedure unit. In a similar way, both the evaluation procedure unit and the second fetch procedure unit can not proceed with processing, so that the other event data can not be fetched from the storage unit by the second fetch unit.

As described hereinbefore, when a logic circuit to be simulated such as an oscillator or the like has a unit independently operating without being controlled by an external unit, its operation is rapidly simulated far ahead of the other units, hindering smooth simulation of the entire apparatus.

(Third Fetch Procedure)

In order to solve the problems that the apparatuses with either the first or second fetch procedure suffer, a third fetch procedure has been proposed, for example, in Japanese Patent Publication No. 63-278150, Japanese Patent Publication No. 1-230142, and U.S. Pat. No. 5,053,980. These simulation apparatuses execute both the first and second fetch procedures in parallel, and then execute evaluation procedures for event data fetched by these fetch procedures.

Figure 3:
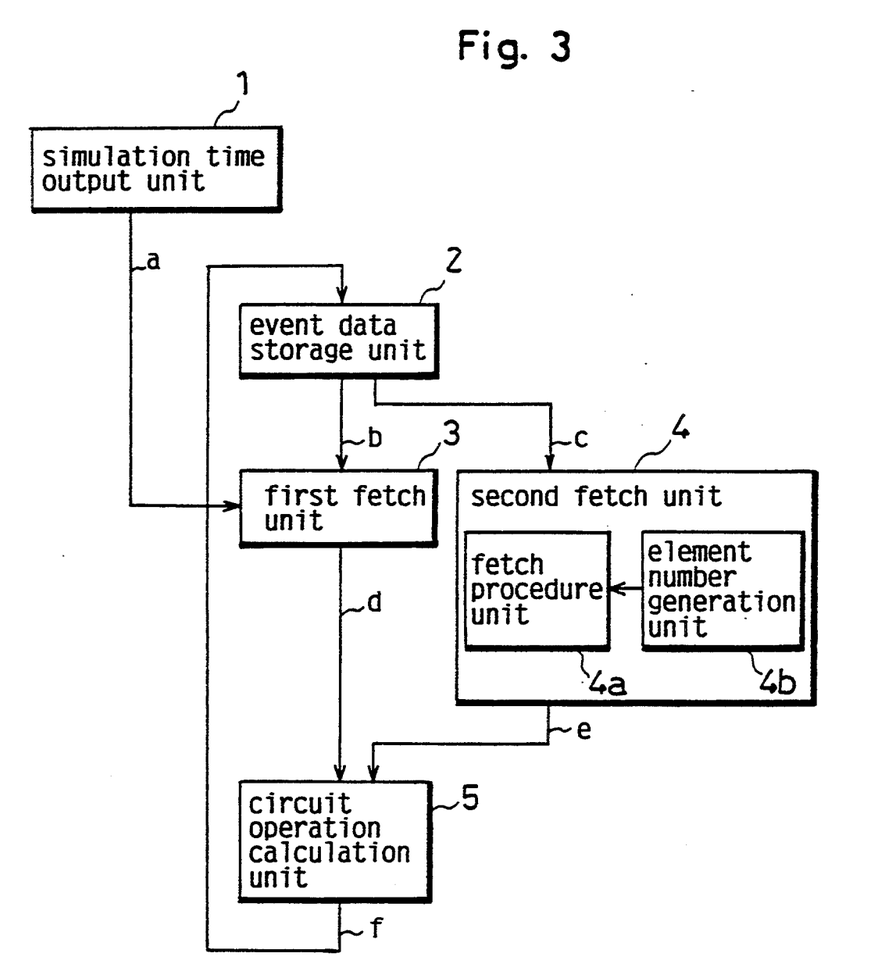
FIG. 3 shows the construction of a conventional logic simulation apparatus.

Such a simulation apparatus comprises, as shown in FIG. 3, a simulation time output unit 1, an event data storage unit 2, a first fetch unit 3, a second fetch unit 4, and a circuit operation calculation unit 5, the second fetch unit 4 includes a fetch procedure unit 4a and an element number generation unit 4b. The letters a through f indicate control/data lines.

The event data storage unit 2 stores unevaluated event data. The simulation time output unit 1 outputs data indicating current simulation time to the control/data line a. When it has been verified that no event data containing the event time equal to the current simulation time is present, the unit 1 increments the simulation time by a predetermined unit of time to output data indicating the simulation time updated.

The first fetch unit 3 refers to event data stored in the event data storage unit 2 through the control/data line b, fetches one whose event time is equal to the simulation time transmitted from the simulation time output unit 1 through the control/data line a, and then outputs it through the control/data line d. The event data fetched is struck off the event data storage unit 2.

The element number generation unit 4b provided in the second fetch unit 4 sequentially selects elements in a logic circuit to be simulated at a predetermined timing, and then outputs element identification data identifying the elements selected, such as their element numbers.

The second fetch unit 4 refers to event data indicating changes of the signal status of the input terminals of the elements indicated by the element numbers thus outputted, fetches one meeting the requirements to calculate the updated signal status of the above-mentioned output terminal regardless of the simulation time, and then outputs it through the control/data line e. The event data fetched is struck off the event data storage unit 2 in this case, too.

The circuit operation calculation unit 5 receives event data from either the first fetch unit 3 or the second fetch unit 4 through either the control/data lines d or e to carry out an evaluation procedure. In other words, the unit 5 calculates the updated signal status of the output terminal of the element indicated by the event data.

If the signal status has changed, the circuit operation calculation unit 5 proceeds to a transmission procedure: new event data is generated which indicates a change of the signal status of the input terminal(s) of any element connected with the output terminal, and then outputs it through the control/data line f.

The event data storage unit 2 receives event data thus outputted to store it. Thus, the simulation proceeds through the repetition of the above operation.

As described hereinbefore, employing both the first and second fetch procedures can realize a considerable increase in simulation speed because it permits adoption of a parallel procedure and/or a pipeline procedure for event data fetched by the second fetch unit 4. Moreover, such employment can simulate an operation of a logic circuit having a feedback loop because event data that can not be fetched by the second fetch unit 4 can be fetched by the first fetch unit 3 when the simulation time comes to the event time of the event data.

This simulation is exercised as follows. In the logic circuit shown in FIG. 1, if event data for either the input terminals 11b or 12b is present, that is fetched by the first fetch unit 3 when the simulation time comes to the event time of the event data, even without the event data for either the input terminals 11a or 12a, and then applied an evaluation procedure and a transmission procedure by the circuit operation calculation unit 5.

In the logic circuit shown in FIG. 2, event data for the first input terminal 9a is serially fetched by the first fetch unit 3 in process of the simulation time in the same manner as the logic circuit of FIG. 1.

However, the simulation apparatus with the third fetch unit still can not totally avoid the above-mentioned second problem caused during the simulation of the operation of the logic circuit shown in FIG. 2. This is because the event time for the first input terminal 9a, newly generated based on the event data for the input terminal 8b fetched by the second fetch unit 4, is far ahead of the simulation time at that moment. Before such event data is fetched by the first fetch unit 3, event data which is ahead in time is generated. Thus, the event data storage unit 2 tends to overflow, leading to a deadlock.

(Improved Third Fetch Procedure)

The applicants of this invention have proposed a simulation apparatus capable of perfectly preventing deadlocks, which are caused by overflows at the event data storage unit, in Japanese Patent Application No. 2-75073. This apparatus has a mechanism which detects a sign that as much event data as will cause an overflow are going to be generated, generally using both the first and second fetch procedures, while using exclusively the first fetch procedure for the simulation when a sign of an overflow is detected, thereby avoiding deadlocks.

Even the improved third fetch apparatus has a problem that the increased speed of simulations with a parallel procedure and/or a pipeline procedure can not be optimized because the second fetch procedure must be suspended for all the elements in order to avoid the second problem caused by the operation of just part of the circuit such as an oscillator circuit.

SUMMARY OF THE INVENTION

The object of this invention is to provide a method and apparatus for logic simulation of a logic circuit which is free from deadlocks even with a feedback loop such as an oscillator circuit, and which adopts a parallel procedure and/or a pipeline procedure to improve the simulation speed.

The object can be achieved by a method for simulating an operation of an event driven logic circuit in response to changes of the signal status of each terminal of all the elements in the logical circuit, based on event data each containing event time indicating when the signal status has changed, status change indicating how the status has changed, an element identifier identifying the element, and a terminal identifier identifying the terminal, the method comprising a simulation time output step for outputting data indicating simulation time which is continuously counted up; a first selection step for selecting the event data whose event time is equal to the simulation time; a second selection step for selecting the event data whose event time is earliest among event data present for all the input terminals of the element corresponding to the event data; a simulation step for generating new event data depending on a change of the signal status of the output terminal of the element corresponding to the event data, based on the event data selected by each selection step; and a control step for suspending the operation in the second selection step based on the event data selected by the second selection step, the suspension being exercised separately for each element.

The object can be achieved also by an apparatus for simulating an operation of an event driven logic circuit in response to changes of the signal status of each terminal of all the elements in the logical circuit, based on event data each containing event time indicating when the signal status has changed, status change indicating how the status has changed, an element identifier identifying the element, and a terminal identifier identifying the terminal, the apparatus comprising an event data storage device for storing event data; a simulation time output device for outputting data indicating simulation time which is continuously counted up; a first selection device for selecting the event data whose event time is equal to the simulation time; a second selection device for selecting the event data whose event time is earliest among event data present for all the input terminals of the element corresponding to the event data; a simulation device for generating new event data depending on a change of the signal status of the output terminal of the element corresponding to the event data, based on the selected event data to store to the event data storage device; and a control device for suspending the operation in the second selection step based on the event data selected by the second selection step, the suspension being exercised separately for each element.

According to the above-mentioned construction, event data which might cause a deadlock is simulated based exclusively on the first selection step or on the selection by the first selection device, while the other event data is simulated based additionally on the second selection step or on the selection of the second selection device, thereby improving the simulation speed.

Even elements which might cause a deadlock can be simulated, as long as the number of event data is little or it is carried out at a limited frequency, based additionally on the second selection step or on the selection of the second selection device.

Whether the simulation based additionally on the second selection step or on the selection of the second selection device should be exercised or not may be determined by comparing element numbers assigned to every element and a predetermined threshold, or by using control information corresponding to each element.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawing.

DESCRIPTION OF THE PREFERRED EMBODIMENTS

Preferred embodiments of this invention are described with reference to the accompanying drawings.

Figure 4:
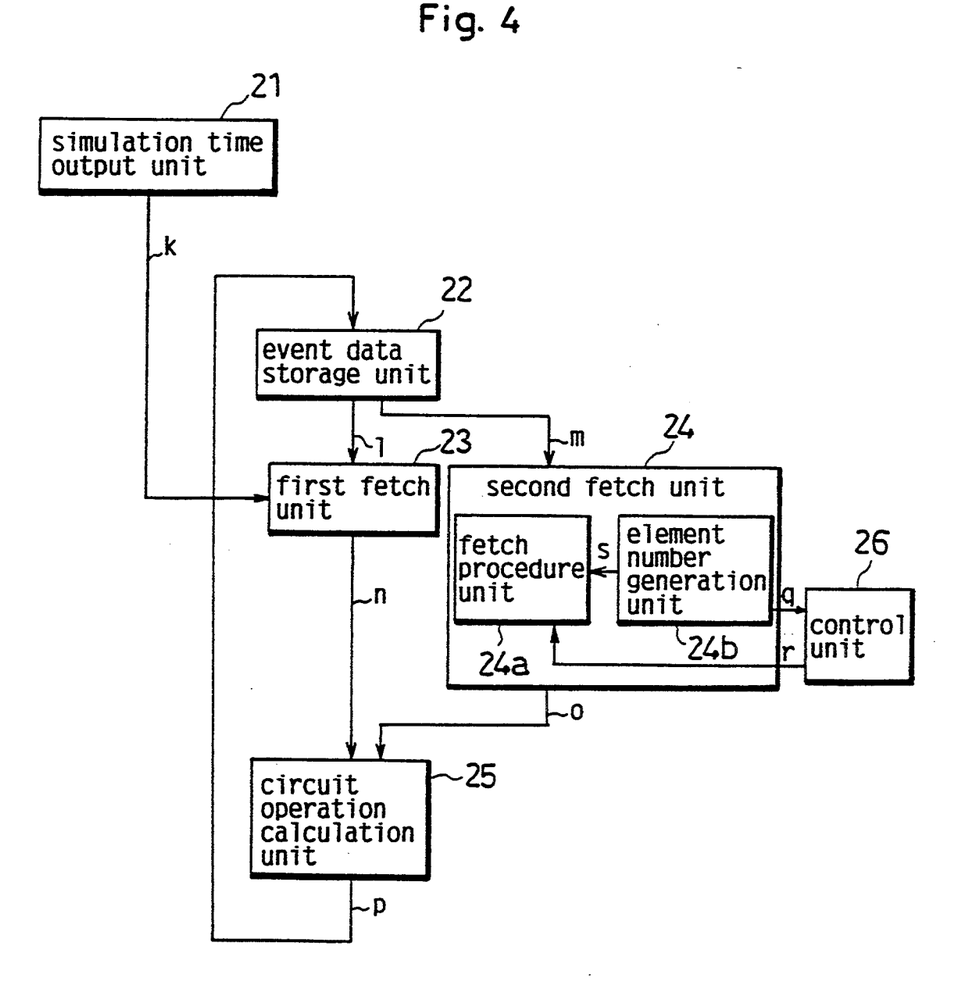
FIG. 4 shows the construction of the logic simulation apparatus of an embodiment of this invention.

The apparatus for simulating a logic circuit of this invention comprises, as shown in FIG. 4, a simulation time output unit 21, an event data storage unit 22, a first fetch unit 23, a second fetch unit 24, a circuit operation calculation unit 25, and a control unit 26, the second fetch unit 24 includes a fetch procedure unit 24a and an element number generation unit 24b. The letters k through s indicate control/data lines.

The event data storage unit 22 stores unevaluated event data. The simulation time output unit 21 outputs data indicating current simulation time through the control/data line k. When it has been verified that no event data containing the event time equal to the current simulation time is present, the unit 21 increments the simulation time by a predetermined unit of time to output data indicating the simulation time updated.

The first fetch unit 23 refers to event data stored in the event data storage unit 22 through the control/data line I, fetches one whose event time is equal to the simulation time transmitted from the simulation time output unit 21 through the control data line k, and then outputs it through the control/data line n. The event data fetched is struck off the event data storage unit 22.

The element number generation unit 24b provided in the second fetch unit 24 sequentially selects elements in a logic circuit to be simulated at a predetermined timing, and then outputs element identification data identifying the selected elements, such as their element numbers through the control/data lines q and s. In the selection of the elements, all in the logic circuit may be scanned in sequence, or those stored either earlier or later in the event data storage unit 22 may be chosen earlier. The element numbers thus outputted are given to the control unit 26 besides being directly inputted to the fetch procedure unit 24a.

The control unit 26 judges whether event data for the elements indicated by their element numbers can be fetched or not by comparing them with a predetermined threshold and then outputs either a fetch permission signal or a fetch prohibition signal through the control/data line r. Such a predetermined threshold is determined before element numbers are assigned to every element in a logical circuit to be simulated. Each element is assigned a smaller number than the threshold if a deadlock may be caused by the fetch procedure of the second fetch unit 24.

Figure 5:
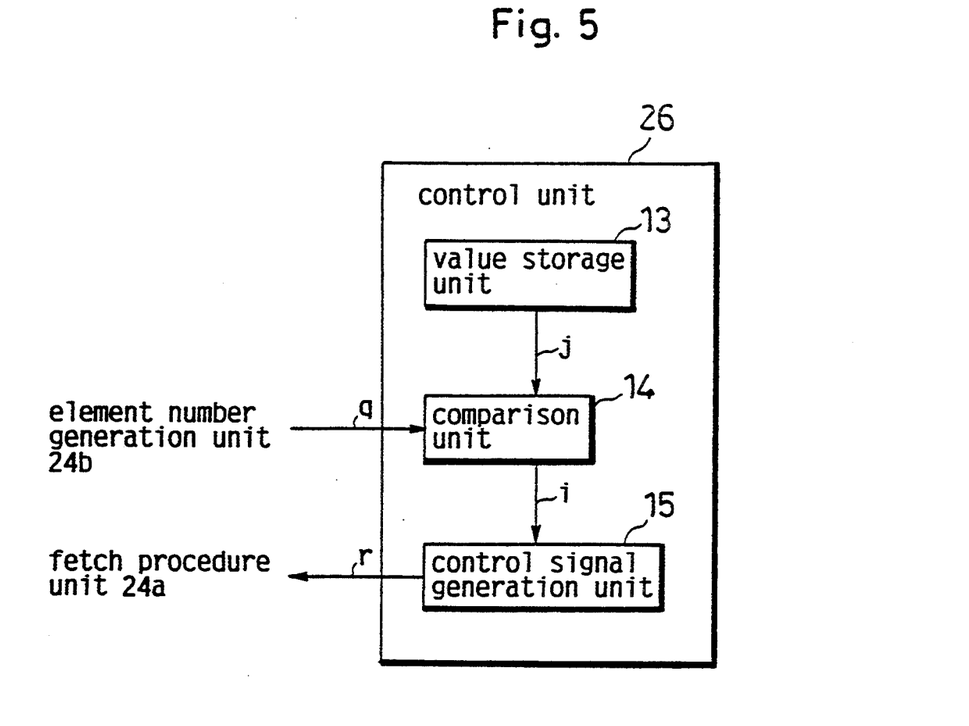
FIG. 5 shows the construction of the control unit of the embodiment.

The control unit 26, as shown in FIG. 5, comprises a value storage unit 13, a comparison unit 14, and a control signal generation unit 15. The letters i and j indicate control/data lines. The value storage unit 13 stores a threshold and then outputs it to the control/data line j.

The comparison unit 14 compares an element number outputted from the element number generation unit 24b and a threshold outputted from the value storage unit 13, and then outputs a true value through the control/data line i if the element number is equal to or larger than the threshold, and a false value if the element number is smaller.

The control signal generation unit 15 reads the value outputted from the comparison unit 14, and then outputs a fetch permission signal through the control/data line r if it is a true value, and a fetch prohibition signal if it is a false value.

The second fetch unit 24 refers to event data indicating a change of the signal status of the input terminal of the element indicated by the element number thus outputted through the control/data line m when received a fetch permission signal. Then the unit 24 fetches the event data meeting the two requirements shown below required to calculate the updated signal status of the output terminal regardless of the simulation time, and then outputs it through the control/data line o.

1. data for at least one event is present for each input terminal of the element.
2. the event time of the event data is earlier than that of any other input terminals.

The event data fetched is struck off the event data storage unit 22 in this case, too.

The fetch procedure is not exercised if event data for at least one of the input terminals of the element is not present.

On the other hand, when receiving a fetch prohibition signal, the second fetch unit 24 does not refer to nor fetch event data in the event data storage unit 22.

The circuit operation calculation unit 25 receives event data from either the first fetch unit 23 or the second fetch unit 24 through either the control/data lines n or o to carry out an evaluation procedure. In other words, the unit 25 calculates the updated signal status of the output terminal of an element indicated by the event data based on unillustrated element definition data which indicates the relationship between both status of the input terminals and the output terminals of each element.

If the signal status has changed, the circuit operation calculation unit 25 proceeds to a transmission procedure: new event data is generated which indicates a change of the signal status of the input terminal(s) of any element connected with the output terminal, based on an unillustrated net list which shows the connective relationship among all the elements in a logic circuit to be simulated, and then outputs it through the control/data line p.

The event data storage unit 22 receives event data outputted by the circuit operation calculation unit 25 to store it. Thus, the simulation proceeds through the repetition of the above operation.

Both the first fetch unit 23 and the second fetch unit 24 are constructed independent of the circuit operation calculation unit 25 so that different event data can be processed in parallel by a pipeline procedure.

As the simulation time output unit 21, the event data storage unit 22, the first fetch unit 23, the second fetch unit 24, and the circuit operation calculation unit 25, their equivalents disclosed in the U.S. Pat No. 5,053,980 or ones added some simple modification thereto may be used.

The difference between element numbers assigned to every element in a logic circuit to be simulated and a threshold set in the value storage unit 13 is described as follows.

Figure 6:
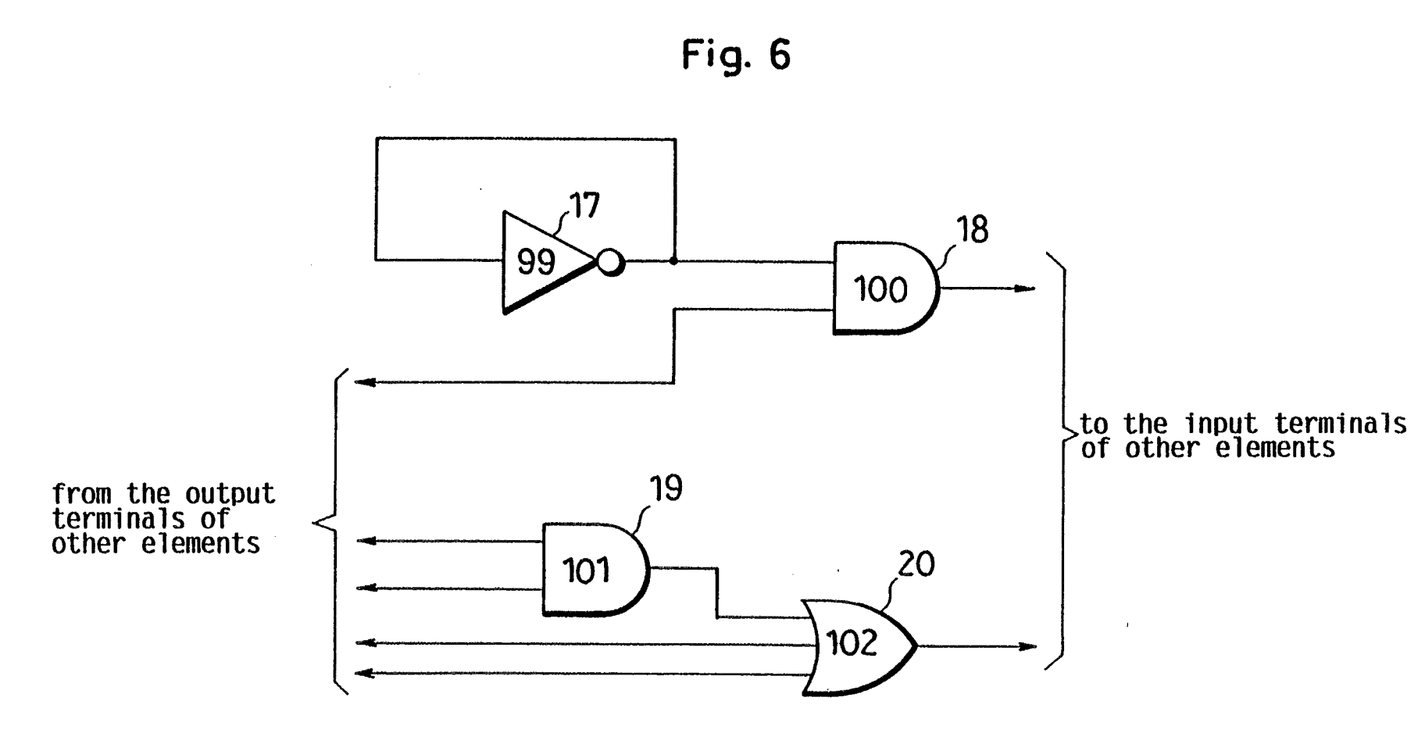
FIG. 6 shows part of a sample logic circuit to be simulated.

Simulated is an operation of a logic circuit comprising, as shown in FIG. 6, an inverter 17 forming an oscillator circuit, two 2-input AND gates 18 and 19, and a 3-input OR gate 20.

When, for example, 100 is intended to store as a threshold, the inverter 17 is assigned 99 element numbers, the AND gates 18 and 19, and the OR gate 20 being assigned 100, 101, and 102 respectively. This assignment makes the control unit 26 control the second fetch unit 24 not to fetch event data for the input terminal of the inverter 17 if the threshold is larger than the element number, so that it is fetched exclusively by the first fetch unit 23 synchronously with the simulation time. On the other hand, event data for the input terminal of the AND gates 18 and 19, and the OR gate 20 can be fetched by the second fetch unit 24 as long as it meets the above-mentioned requirements. Otherwise, it can be fetched by the first fetch unit 23 when its simulation time becomes equal to the event time of the event data.

More precisely, the event data for the input terminal of the AND gate 18 based on the output from the inverter 17 is fetched from the second fetch unit 24 when event data for the other input terminal is present. Otherwise, it is fetched by the first fetch unit 23 by the time the next data is generated.

As described hereinbefore, event data which might cause a deadlock when fetched by the second fetch unit 24 is prohibited to be fetched, while the other event data is permitted to be fetched to process regardless of the simulation time, thereby improving the simulation speed.

Furthermore, whether event data is fetched by the second fetch unit 24 or not is determined by comparing the threshold and the element number, so that each element can separately select between a simulation with both the first and second fetch procedures and another with the first fetch procedure only by appropriate assignment of element numbers.

The Other Embodiments

Figure 7:
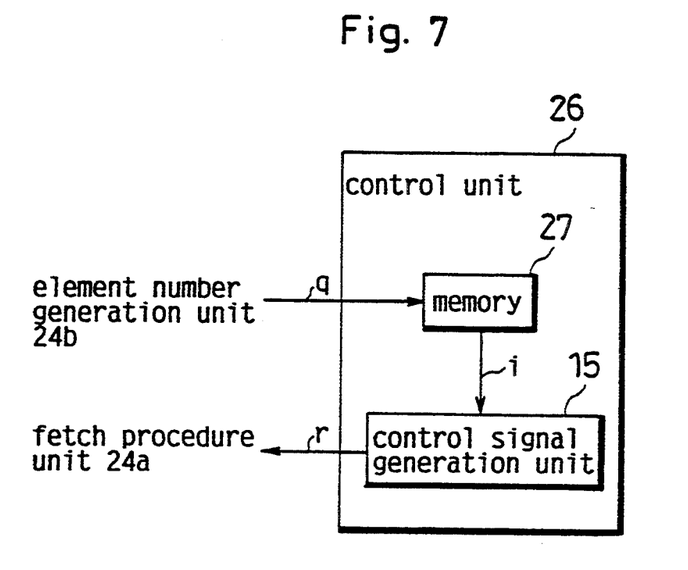
FIG. 7 shows the construction of the control unit of another embodiment.

As shown in FIG. 7, the control unit 26 may employ a memory 27 in place of both the value storage unit 13 and the comparison unit 14. In this unit 26, element numbers outputted from the element number generation unit 24b are inputted as addresses to the memory 27. The memory 27 stores either a true value or a false value depending on whether the second procedure is permitted or not to an area having as its address the element numbers of all the element in a logic circuit to be simulated, and then outputs an either value corresponding to the element number outputted.

The control signal generation unit 15 outputs a fetch permission signal to the fetch procedure unit 24a when the value outputted from the memory 27 is a true value, and a fetch prohibition signal when the value is a false value.

Figure 8:
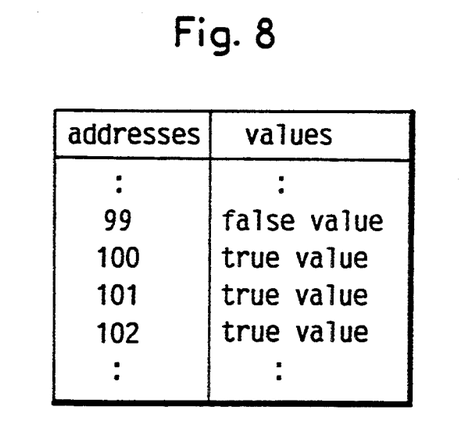
FIG. 8 shows the contents of the memory in the control unit of further another embodiment.

Hence, when the inverter 17 having an oscillator circuit is not allowed to use the second fetch procedure to simulate the logic circuit shown in FIG. 6, a false value is stored in the area for the address 99 corresponding to the element number 99 while true values are stored in the remaining areas for the addresses 100 through 102 corresponding to the element numbers 100 through 102 as shown in FIG. 8.

According to the construction described hereinbefore, whether the second fetch procedure is permitted or not can be separately designated for each element and the variation of element numbers to be assigned can be increased. Instead of using element numbers as addresses, a lookup-table may be used in which every element number is stored together with a true or false value corresponding thereto.

In the above-mentioned embodiments, elements which are prohibited to be fetched by the second fetch unit 24 are always fetched by the first fetch unit 23. However, such elements may be constructed so that they can be fetched by the second fetch unit 24 at a predetermined frequency. For example, they may be fetched by the unit 24 every time a certain number of element numbers are outputted.

The value storage unit 13 may be made to store several thresholds in different levels, or a level number in place of true/false values, and the above frequency may be varied depending on the size of the level number or of each threshold. In such a case, the element numbers or level numbers assigned to every element may be determined, for example, by the number of the serial-connected element(s) composing a feedback loop.

The fetching by the second fetch unit 24 may be prohibited only in case of necessity judging from the remaining capacity of the event data storage unit 2.

An apparatus may be constructed so that a threshold inputted to the comparative unit 14 and/or the above-mentioned frequency is varied depending on the remaining capacity.

The fetching frequency for the same element and the time difference between the event time and the simulation time may be used to determine whether the fetching by the second fetch unit 24 should be exercised or not instead of corresponding to each element.

In the above embodiments, to make the description simple, the second fetch unit 24 is designed so that event data is fetched only if data for at least one event is present for each input terminal of an element. However, when, for example, event data having the earliest event time for one of the input terminals of the AND gate (the OR gate) indicates the ending of an inactive signal status (an active signal status), the output of the AND gate (the OR gate) is verified to be inactive (active) until the event time. Therefore, the second fetch unit 24 may be designed so that even if event data is not present for all the input terminals, the event data up to the event time present can be fetched. To realize the design, the net list can be made to hold information indicating whether the "dominative" signal status is in active level or inactive level for each element or terminal, and the above-mentioned requirements to fetch event data can be changed based on the information.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A method for simulating an operation of an event-driven logic circuit in response to changes of the signal status of each terminal of the elements in the logical circuit, the method being based upon event-data sets, each event-data set containing an event time indicating when the signal status has changed, a status change indicating how the status has changed, an element number identifying the element, and a terminal identifier identifying the terminal, said method comprising:
a simulation time output step for outputting data indicating simulation time which is consecutively incremented;
a first selection step for selecting the event-data set whose event time is equal to the simulation time;
a second selection step for selecting the event-data set whose event time is earliest among event-data sets present for all the input terminals of the element corresponding to the selected event-data set;

a simulation step for generating new event-data sets depending on a change of the signal status of the output terminal of the element corresponding to the selected event-data set, based on the event-data set selected by either of the two selection steps; and a control step for selectively suspending the operation in said second selection step based on a comparison between the element number in the event-data set selected by said second selection step and a predetermined threshold, the suspension being exercised separately for each element.

2. The method of claim 1, wherein a plurality of said thresholds are predetermined, said comparison compares each threshold and said element numbers, and a determination step determines after said comparison to exercise the suspension at a frequency corresponding to the comparison.

3. The method of claim 1, further comprising a detection step for detecting the executional status of the simulation, a plurality of said thresholds being predetermined, said comparison step comparing each threshold and said element numbers, a determination step determining whether the suspension should be exercised or not, based on the executional status detected and on the comparison.

4. The method of claim 1, wherein said control step comprises a determination step for determining whether the operation of said second selection step should be suspended or not, based on predetermined control information corresponding to each element.

5. The method of claim 4, wherein said control information contains information indicating whether the suspension should be exercised or not.

6. The method of claim 4, wherein said control information contains one of a plurality of values, and said determination step determines to exercise the suspension at a frequency corresponding to the value of said control information.

7. The method of claim 4, further comprising a detection step for detecting the executional status of the simulation, said control information containing one of a plurality of values, said determination step determining whether the suspension should be exercised or not based on the value of the control information and on the executional status detected.

8. An apparatus for simulating an operation of an event-driven logic circuit in response to changes of the signal status of each terminal of the elements in the logical circuit, based upon event-data sets, each event-data set containing an event time indicating when the signal status has changed, a status change indicating how the status has changed, an element number identifying the element, and a terminal identifier identifying the terminal, said apparatus comprising:

event data storage means for storing event data;

simulation time output means for outputting data indicating simulation time which is consecutively incremented;

first selection means for selecting the event-data set whose event time is equal to the simulation time;

second selection means for selecting the event-data set whose event time is earliest among event-data sets present for all the input terminals of the element corresponding to the selected event-data set;

simulation means for generating new event-data sets depending on a change of the signal status of the output terminal of the element corresponding to the selected event-data set, based on the event data set selected by either of the two selection means to store to said event data storage means; and control means for selectively suspending the operation in said second selection means based on a comparison between the element number in the event-data set selected by said second selection means and a predetermined threshold, the suspension being exercised separately for each element.

9. The apparatus of claim 8 said control means further comprising a threshold storage means, a comparison means, and a determination means, wherein said threshold storage means stores a plurality of said thresholds, said comparison means compares each threshold and said element numbers, and said determination means determines after said comparison to exercise the suspension at a frequency corresponding to the comparison.

10. The apparatus of claim 9, further comprising detection means for detecting the executional status of the simulation, said threshold storage means storing said plurality of thresholds, said determination means determining whether the suspension should be exercised or not based on the executional status detected and on the comparison.

11. The apparatus of claim 8, wherein said control means comprises control information storage means for storing predetermined control information by associating it with each element;

control information readout means for reading out prestored control information; and determination means for determining whether the operation of said second selection means should be suspended or not based on the control information read out.

12. The apparatus of claim 11, wherein said control information storage means stores control information to an area having an element number as its address.

13. The apparatus of claim 11, wherein said control information storage means holds a lookup-table in which data indicating an element number is coupled with corresponding control information.

14. The apparatus of claim 11, wherein said control information storage means holds information indicating whether the suspension should be exercised or not as control information.

15. The apparatus of claim 11, wherein said control information storage means holds one of a plurality of values as control information, said determination means determines to exercise the suspension at a frequency corresponding to the value of the control information.

16. The apparatus of claim 11, further comprising a detection means for detecting the executional status of the simulation, said control information storage means storing one of a plurality of values as control information, said determination means determining whether the suspension should be exercised or not based on the detected executional status and the value of the control information.

* * * * *